US011456441B2

(12) United States Patent
Song et al.

(10) Patent No.: US 11,456,441 B2
(45) Date of Patent: Sep. 27, 2022

(54) DISPLAY PANEL WITH LIGHT INTERFERENCE AND MANUFACTURING METHOD THEREFOR, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Lifang Song, Beijing (CN); Minghung Hsu, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 180 days.

(21) Appl. No.: 16/651,497

(22) PCT Filed: May 20, 2019

(86) PCT No.: PCT/CN2019/087636
§ 371 (c)(1),
(2) Date: Mar. 27, 2020

(87) PCT Pub. No.: WO2019/223652
PCT Pub. Date: Nov. 28, 2019

(65) Prior Publication Data
US 2020/0266387 A1  Aug. 20, 2020

(30) Foreign Application Priority Data

May 21, 2018 (CN) .......................... 201810489915.1

(51) Int. Cl.
*H01L 29/08* (2006.01)
*H01L 51/52* (2006.01)
(Continued)

(52) U.S. Cl.
CPC ........ *H01L 51/5265* (2013.01); *H01L 27/322* (2013.01); *H01L 51/5056* (2013.01);
(Continued)

(58) Field of Classification Search
CPC .......................... H01L 51/5265; H01L 27/322
See application file for complete search history.

(56) References Cited

U.S. PATENT DOCUMENTS 7,570,324 B2 * 8/2009 Ohmuro ............ G02F 1/133514
349/114
9,246,136 B2   1/2016 Song et al.
(Continued)

FOREIGN PATENT DOCUMENTS

CN          1540366 A    10/2004
CN        103000580 A     3/2013
(Continued)

OTHER PUBLICATIONS

May 6, 2020—(CN) First Office Action Appn 201810489915.1 with English Translation.

*Primary Examiner* — Caleb E Henry
(74) *Attorney, Agent, or Firm* — Banner & Witcoff, Ltd.

(57) ABSTRACT

A display panel and a manufacturing method thereof, and a display device are provided. The display panel includes a base substrate and a plurality of pixels. Each pixel includes a plurality of sub-pixels of different colors; each sub-pixel includes a reflection layer, a first color filter layer at a side of the reflection layer away from the base substrate, a first electrode at a side of the first color filter layer away from the base substrate, a light-emitting layer at a side of the first electrode away from the base substrate, and a second electrode at a side of the light-emitting layer away from the base substrate. In each pixel, a color of the first color filter layer of the each sub-pixel is same as a color of the respective (Continued)

sub-pixel; thicknesses of the first color filter layers of the plurality of sub-pixels are different from each other.

19 Claims, 2 Drawing Sheets

(51) Int. Cl.
    *H01L 27/32*     (2006.01)
    *H01L 51/50*     (2006.01)
    *H01L 51/56*     (2006.01)

(52) U.S. Cl.
    CPC ...... *H01L 51/5072* (2013.01); *H01L 51/5088* (2013.01); *H01L 51/5092* (2013.01); *H01L 51/56* (2013.01)

(56) References Cited

U.S. PATENT DOCUMENTS

| | | | |
|---|---|---|---|
| 9,614,011 | B2 | 4/2017 | Sato et al. |
| 10,002,911 | B2 | 6/2018 | Bai et al. |
| 2013/0320842 | A1 | 12/2013 | Park et al. |
| 2017/0090246 | A1* | 3/2017 | Seo .................. G02F 1/133603 |
| 2017/0213876 | A1* | 7/2017 | Ohsawa .................. H01L 27/322 |
| 2017/0236879 | A1* | 8/2017 | Kubota ................ G02B 27/017 257/40 |
| 2017/0317148 | A1* | 11/2017 | Uchida ............... H01L 51/5271 |
| 2018/0182834 | A1* | 6/2018 | Toyotaka ............. H01L 27/3262 |
| 2018/0269267 | A1* | 9/2018 | Ohchi ................ H01L 27/3246 |
| 2018/0358417 | A1* | 12/2018 | Hamada ............. H01L 51/5221 |
| 2019/0004407 | A1* | 1/2019 | Pousthomis ......... G02B 6/0026 |
| 2019/0164473 | A1* | 5/2019 | Hack ................. H01L 51/5203 |

FOREIGN PATENT DOCUMENTS

| | | |
|---|---|---|
| CN | 103296053 A | 9/2013 |
| CN | 103779386 A | 5/2014 |
| CN | 104600097 A | 5/2015 |
| CN | 105070739 A | 11/2015 |
| CN | 105892042 A | 8/2016 |
| CN | 206179867 U | 5/2017 |
| CN | 107331688 A | 11/2017 |
| CN | 108447895 A | 8/2018 |

* cited by examiner

DISPLAY PANEL WITH LIGHT INTERFERENCE AND MANUFACTURING METHOD THEREFOR, AND DISPLAY DEVICE

The application is a U.S. National Phase Entry of International Application No. PCT/CN2019/087636 filed on May 20, 2019, designating the United States of America and claiming priority to Chinese Patent Application No. 201810489915.1, filed on May 21, 2018. The present application claims priority to and the benefit of the above-identified applications and the above-identified applications are incorporated by reference herein in their entirety.

TECHNICAL FIELD

The present disclosure relates to a display panel and a manufacturing method thereof, and a display device.

BACKGROUND

With the advent of the information age, conventional cathode ray tube (CRT) displays have been replaced by flat panel displays. Currently, one of the most commonly used flat panel displays is liquid crystal display (LCD). LCD displays have characteristics of mature technology and low price. However, because the LCD displays do not have a self-luminescence function, and thus there are technical limitations in contrast, viewing angle, bendable display and power consumption for the LCD displays. As a new generation of display technology, organic light-emitting diode (OLED) has display characteristics of self-luminescence, wide viewing angle, short reaction time, high luminous efficiency, wide color gamut, low working voltage, thin panel, large size and flexibility, so that the organic light-emitting diode (OLED) attracts wide attentions.

Generally, in order to reduce influence of reflected light of ambient light on the OLED display, it is necessary to provide a circular polarizer on the light-exiting surface of an OLED display. However, the transmissivity of a commonly used circular polarizer is only about 44%, which causes most of light to be lost when the light emitted by the light emitting layer passes through the circular polarizer, and significantly reduces the brightness of the OLED display. At present, many technologies are devoted to increase light extraction efficiency, improve device structure, etc., but they can only increase the brightness of the OLED display by a small margin, and cannot effectively solve the brightness loss caused by the circular polarizer.

SUMMARY

At least one embodiment of the present disclosure provides a display panel, and the display panel comprises: a base substrate, a plurality of pixels which are arranged in an array and on the base substrate. Each of the plurality of pixels comprises a plurality of sub-pixels of different colors; each of the plurality of sub-pixels comprises: a reflection layer, a first color filter layer, a first electrode, a light-emitting layer, and a second electrode. The reflection layer is on the base substrate; the first color filter layer is at a side of the reflection layer away from the base substrate; the first electrode is at a side of the first color filter layer away from the base substrate; the light-emitting layer is at a side of the first electrode away from the base substrate; the second electrode is at a side of the light-emitting layer away from the base substrate. In the each of the plurality of pixels, a color of the first color filter layer of the each of the plurality of sub-pixels is same as a color of the respective sub-pixel where the first color filter layer of the each of the respective sub-pixel is located, and thicknesses of the first color filter layers of the plurality of sub-pixels are different from each other.

For example, in the display panel provided by at least one embodiment of the present disclosure, the first electrode is a transparent electrode layer or a transflective electrode layer, and the second electrode is a transparent electrode layer or a transflective electrode layer.

For example, in the display panel provided by at least one embodiment of the present disclosure, the each of the plurality of pixels comprises a red sub-pixel, a green sub-pixel and a blue sub-pixel; the thickness in the direction perpendicular to the base substrate of the first color filter layer of the green sub-pixel is configured that an optical path difference between second light which is generated by reflection of first light by a light-exiting surface of the display panel and third light generated by the first light which is reflected by a reflective surface of the first color filter layer and exits from the light-exiting surface of the display panel is equal to odd number of times of half-wavelength of the first light; and the first light is green light which is propagated toward the light-exiting surface of the display panel in ambient light.

For example, in the display panel provided by at least one embodiment of the present disclosure, a wavelength of the green light is 550 nm~560 nm.

For example, in the display panel provided by at least one embodiment of the present disclosure, light that is emitted by the light-emitting layer in the red sub-pixel comprises red light; a red stationary wave is generated in the red sub-pixel by the red light emitted by the light-emitting layer in the red sub-pixel and red light, that enters in the red sub-pixel, in the ambient light; and the thickness in the direction perpendicular to the base substrate of the first color filter layer of the red sub-pixel is configured to allow the light-emitting layer in the red sub-pixel to be at an antinode of the red stationary wave.

For example, in the display panel provided by at least one embodiment of the present disclosure, the thickness in the direction perpendicular to the base substrate of the first color filter layer of the red sub-pixel is configured to allow the light-emitting layer in the red sub-pixel to be at a second antinode of the red stationary wave.

For example, in the display panel provided by at least one embodiment of the present disclosure, light that is emitted by the light-emitting layer in the blue sub-pixel comprises blue light; a blue stationary wave is generated in the blue sub-pixel by the blue light emitted by the light-emitting layer in the blue sub-pixel and blue light, that enters in the blue sub-pixel, in the ambient light; and the thickness in the direction perpendicular to the base substrate of the first color filter layer of the blue sub-pixel is configured to allow the light-emitting layer in the blue sub-pixel to be at an antinode of the blue stationary wave.

For example, in the display panel provided by at least one embodiment of the present disclosure, the thickness in the direction perpendicular to the base substrate of the first color filter layer of the blue sub-pixel is configured to allow the light-emitting layer in the blue sub-pixel to be at a second antinode of the blue stationary wave.

For example, in the display panel provided by at least one embodiment of the present disclosure, each of the plurality of sub-pixels further comprises: a second color filter layer at a side of the second electrode away from the base substrate;

and in each of the plurality of sub-pixels, a color of the second color filter layer is same as the color of the first color filter layer.

For example, in the display panel provided by at least one embodiment of the present disclosure, in the each of the plurality of pixels, the light-emitting layer in the each of the plurality of sub-pixels emits monochromatic light, and a color of the monochromatic light is same as the color of the second color filter layer.

For example, in the display panel provided by at least one embodiment of the present disclosure, in the each of the plurality of pixels, light emitted by the light-emitting layers in the plurality of sub-pixels is white light.

For example, in the display panel provided by at least one embodiment of the present disclosure, the each of the plurality of sub-pixels further comprises a hole injection layer and a hole transport layer which are between the first electrode and the light-emitting layer and sequentially stacked.

For example, in the display panel provided by at least one embodiment of the present disclosure, the each of the plurality of sub-pixels further comprises an electron injection layer and an electron transport layer which are between the second electrode and the light-emitting layer and sequentially stacked.

For example, in the display panel provided by at least one embodiment of the present disclosure, the display panel further comprises: an encapsulation cover plate at a side of the second color filter layer away from the base substrate.

At least one embodiment of the present disclosure further provides a display device, and the display device comprises any display panel provided by the embodiments of the present disclosure.

At least one embodiment of the present disclosure further provides a manufacturing method of a display panel, and the method comprises: providing a base substrate; forming a plurality of pixels which are arranged in an array on the base substrate, in which each of the plurality of pixels comprises a plurality of sub-pixels of different colors; forming the each of the plurality of sub-pixels comprises: forming a reflection layer on the base substrate; forming a first color filter layer, in which the first color filter layer is at a side of the reflection layer away from the base substrate; forming a first electrode, in which the first electrode is at a side of the first color filter layer away from the base substrate; forming a light-emitting layer, in which the light-emitting layer is at a side of the first electrode away from the base substrate; and forming a second electrode, in which the second electrode is at a side of the light-emitting layer away from the base substrate. In the each of the plurality of pixels, a color of the first color filter layer of the each of the plurality of sub-pixels is same as a color of the respective sub-pixel where the first color filter layer of the respective sub-pixel is located, and thicknesses of the first color filter layers of the plurality of sub-pixels are different from each other.

For example, in the manufacturing method of the display panel provided by at least one embodiment of the present disclosure, the each of the plurality of pixels comprises a red sub-pixel, a green sub-pixel and a blue sub-pixel; the thickness in the direction perpendicular to the base substrate of the first color filter layer of the green sub-pixel is configured to allow an optical path difference between second light which is generated by reflection of first light by a light-exiting surface of the display panel and third light generated by the first light which is reflected by a reflective surface of the first color filter layer and exited from the light-exiting surface of the display panel to be equal to odd number of times of half-wavelength of the first light; and the first light is green light, which is propagated toward the light-exiting surface of the display panel, in ambient light.

For example, in the manufacturing method of the display panel provided by at least one embodiment of the present disclosure, light that is emitted by the light-emitting layer in the red sub-pixel comprises red light; a red stationary wave is generated in the red sub-pixel by the red light emitted by the light-emitting layer in the red sub-pixel and red light, that enters in the red sub-pixel, in the ambient light; and the thickness in the direction perpendicular to the base substrate of the first color filter layer of the red sub-pixel is configured to allow the light-emitting layer in the red sub-pixel to be at an antinode of the red stationary wave.

For example, in the manufacturing method of the display panel provided by at least one embodiment of the present disclosure, light that is emitted by the light-emitting layer in the blue sub-pixel comprises blue light; a blue stationary wave is generated in the blue sub-pixel by the blue light emitted by the light-emitting layer in the blue sub-pixel and blue light, that enters in the blue sub-pixel, in the ambient light; the thickness in the direction perpendicular to the base substrate of the first color filter layer of the blue sub-pixel is configured to allow the light-emitting layer in the blue sub-pixel to be at an antinode of the blue stationary wave.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

Figure 1A:
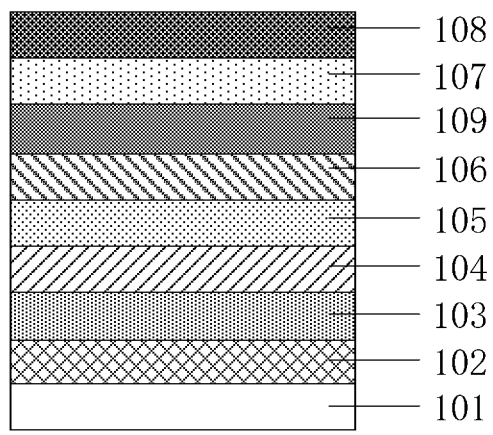
FIG. 1A is a structural schematic diagram of a sub-pixel of a display panel provided by at least one embodiment of the present disclosure.

1/101/201/301—base substrate; 102/202/302—reflection layer; 103/203/303—first color filter layer; 104/204/304—first electrode; 105/205/305—light-emitting layer; 106/206/306—second electrode; 107/207/307—second color filter layer; 108/208/308—encapsulation cover plate; 109/209/309—encapsulation layer.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

The specific implementations of the display panel and the display device provided by the embodiments of the present disclosure are described in detail below with reference to the accompanying drawings. The thicknesses and shapes of the film layers in the accompanying drawings are only intended to illustrate the content of the disclosure, and do not reflect the true proportion.

At least one embodiment of the present disclosure provides a display panel, and the display panel comprises: a base substrate, a plurality of pixels which are arranged in an array on the base substrate. Each of the plurality of pixels comprises a reflection layer, a first color filter layer, a first electrode, a light-emitting layer, and a second electrode. The reflection layer is on the base substrate; the first color filter layer is at a side of the reflection layer away from the base substrate; the first electrode is at a side of the first color filter layer away from the base substrate; the light-emitting layer is at a side of the first electrode away from the base substrate; the second electrode is at a side of the light-emitting layer away from the base substrate. In each of the plurality of pixels, a color of the first color filter layer of the respective sub-pixel is same as a color of a sub-pixel where the first color filter layer of the respective sub-pixel is located, and thicknesses of the first color filter layers of the plurality of sub-pixels are different from each other.

For example, FIG. 1A is a structural schematic diagram of a sub-pixel of a display panel provided by at least one embodiment of the present disclosure. As illustrated in FIG. 1A, each of the plurality of sub-pixels comprises: a base substrate 101 and a plurality of pixels which are arranged in an array on the base substrate 101; each of the plurality of pixels comprises a plurality of sub-pixels of different colors; each of the plurality of sub-pixels comprises: a reflection layer 102 on the base substrate 101, a first color filter layer 103 at a side of the reflection layer 102 away from the base substrate 101, a first electrode 104 at a side of the first color filter layer 103 away from the base substrate 101, a light-emitting layer 105 at the side of the first electrode 104 away from the base substrate 101, and a second electrode 106 at a side of the light-emitting layer 105 away from the base substrate 101. In each of the plurality of pixels, the color of the first color filter layer 103 of the respective sub-pixel is the same as the color of the sub-pixel where the first color filter layer 103 of the respective sub-pixel is located, and the thicknesses of the first color filter layers 103 of the plurality of sub-pixels are different from each other.

For the display panel provided by at least one embodiment of the present disclosure, by disposing the first color filter layer between the first electrode 104 and the base substrate 101, a micro-cavity structure is formed between the reflection layer 102 and the second electrode 106; in the sub-pixel, ambient light that enters the sub-pixel and light (for example, monochromatic light) emitted by the light-emitting layer 105 form a stationary wave between the reflection layer 102 and the second electrode 106, and the thicknesses in the direction perpendicular to the base substrate 101 of the first color filter layers 103 of the plurality of sub-pixels in the same pixel are different from each other. Therefore, the thicknesses of the first color filter layers 103 can be changed to adjust the cavity lengths of the micro-cavities of the respective sub-pixels, so that destructive interference occurs on light of a specific color in the sub-pixel or interference occurs to cause the light of a specific color in the sub-pixel to be enhanced according to demands. The cavity length of the micro-cavity is an optical length between a surface of the reflection layer away from the base substrate and a surface of the second electrode away from the base substrate.

For example, the first electrode 104 is a transparent electrode layer or a half-transmissive and half-reflective electrode layer, and the second electrode 106 is a transparent electrode layer or a half-transmissive and half-reflective electrode layer. Therefore, in the sub-pixel, the ambient light that enters the sub-pixel and the light (for example, monochromatic light) emitted by the light-emitting layer 105 form a stationary wave with higher intensity between the reflection layer 102 and the second electrode 106.

For example, the display panel is an OLED display panel, and for example, the display panel is an OLED display panel of top emission type. For example, the above-mentioned first electrode 104 is an anode. For example, the above-mentioned first electrode 104 is a transflective thin metal layer made of a transparent conductive material such as indium tin oxide (ITO) or metal such as silver. For example, the above-mentioned second electrode 106 is a cathode, the above-mentioned second electrode 106 is a transflective thin metal layer made of a transparent conductive material such as indium tin oxide (ITO) or metal such as silver. For example, the first electrode 104 and the second electrode 106 also adopt indium zinc oxide (IZO) which has a higher transmittance. Obviously, in other embodiments, for example, the first electrode 104 is the cathode, and the second electrode 106 is the anode, and no limitation is given in embodiments of the present disclosure in this respect.

In at least one embodiment of the present disclosure, the reflection layer 102 can increase the light utilization, enhance the intensity of the stationary wave, which is beneficial to enhancing the light of a specific color with better effect by better utilizing the characteristics of the stationary wave. For example, the reflection layer 102 is a metal layer at a side of the first color filter layer closer to the base substrate. For example, the reflection layer 102 is a reflective coating layer which is coated on the surface of the first color filter layer 103 facing toward the base substrate 101, or the reflection layer 102 is a reflective layer formed on the base substrate 102. For example, the reflection layer 102 is made of a metal material with a relatively high reflectivity. For example, the reflection layer 102 is made of metallic silver (Ag) or aluminum (Al), and no limitation is given here. The reflection layers in the sub-pixels can be formed by an evaporation method during a manufacturing process of the display panel.

Figure 1B:
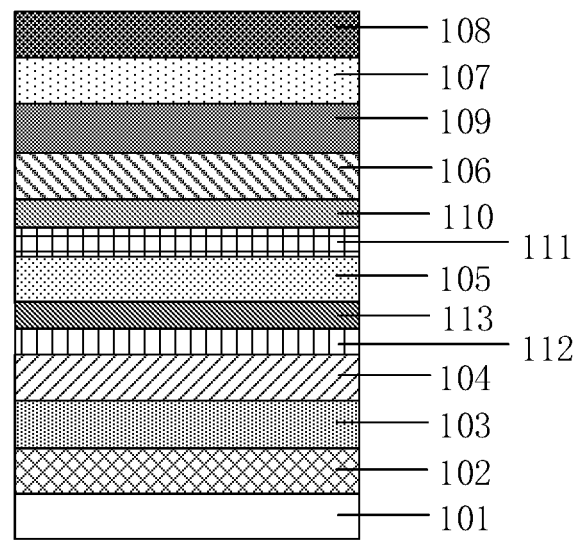
FIG. 1B is a structural schematic diagram of another sub-pixel of a display panel provided by at least one embodiment of the present disclosure.

For example, FIG. 1B is a structural schematic diagram of another sub-pixel of a display panel provided by at least one embodiment of the present disclosure. As illustrated in FIG. 1B, each of the plurality of sub-pixels further comprises a hole injection layer 112 and a hole transport layer 113 which are between the first electrode 104 and the light-emitting layer 105 and are sequentially stacked. Each of the plurality of sub-pixels further comprises an electron injection layer 110 and an electron transport layer 111 which are between the second electrode 106 and the light-emitting layer 105 and sequentially stacked.

Figure 2:
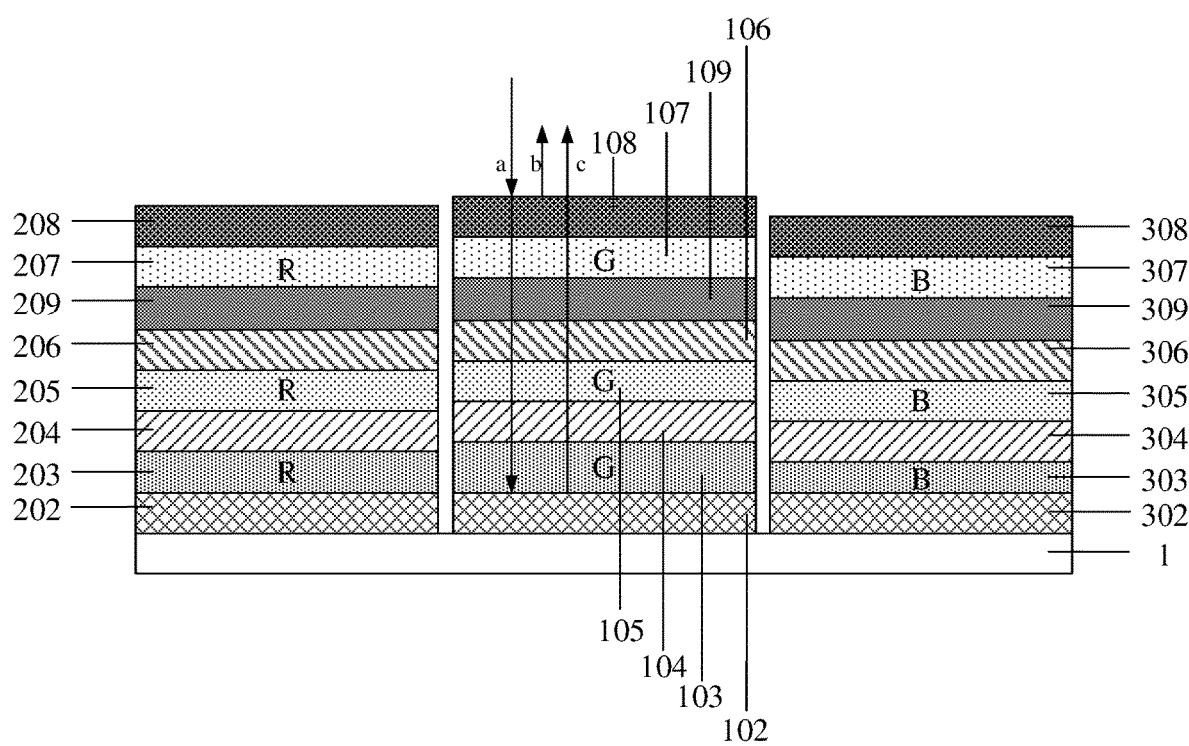
FIG. 2 is a structural schematic diagram of a display panel provided by at least one embodiment of the present disclosure.

FIG. 2 is a structural schematic diagram of a display panel provided by at least one embodiment of the present disclosure. The display panel is described by taking the case where each pixel comprises three sub-pixels as an example in FIG. 2. In practical applications, for example, each pixel comprises sub-pixels in other numbers, and no limitation is given here regarding the number of the sub-pixels in each pixel.

As illustrated in FIG. 2, in each pixel, the color of the first color filter layer 103 is the same as the color of a corresponding sub-pixel where the first color filter layer is located, and FIG. 2 takes the case where the pixel comprises three sub-pixels respectively of red color, green color and blue color as an example. For example, each of the plurality of pixels comprises a red (R) sub-pixel, a green (G) sub-pixel and a blue (B) sub-pixel.

For example, the red sub-pixels, the green sub-pixels and the blue sub-pixels are arranged in an array and distributed on the same the base substrate 1. The first color filter layer in the red sub-pixel 203 can transmit only the red light, the first color filter layer 103 in the green sub-pixel can transmit only the green light, and the first color filter layer 303 in the blue sub-pixel can transmit only the blue light. By this way, on one hand, the cavity length of the micro-cavity of the micro-cavity structure is adjusted by the first color filter layer; on the other hand, the color purity of the light emitted by each sub-pixel is increased, and the color gamut of the display panel can be increased.

Each sub-pixel of the display panel has a micro-cavity effect, the light-emitting spectrum of electroluminescence is narrowed by adjusting the cavity length of the micro-cavity of the micro-cavity structure, so that the intensity of the light of a specific color is decreased by adjusting the cavity length of the micro-cavity, and the intensity of the light of a specific color is also increased by adjusting the cavity length of the micro-cavity. In an embodiment of the present disclosure, in order to reduce the influence of the ambient light on the display panel, the cavity lengths of the micro-cavities of the sub-pixels are adjusted, so that, for example, a destructive interference occurs on the green light, which enters into the display panel, of the ambient light, and the intensity of the red light and the intensity of the blue light in the ambient light are increased, and thus the green light, which is reflected by the display panel, in the ambient light is reduced. Because human eyes are most sensitive to the green light, the adverse influence of the ambient light on the display panel is significantly reduced, and thus it is not necessary to provide a circular polarizer along a light-exiting direction to filter light in the display panel in the embodiments of the present disclosure. In addition, the light intensity of the red light and the light intensity of the blue light can be increased to a certain extent, such that the final brightness of light exiting from the display panel in the embodiment of the present disclosure is higher than the brightness of light exiting from the display panel provided with a circular polarizer in prior art. It is not necessary to provide a circular polarizer along the light-exiting direction to filter light in the display panel provided by at least one embodiment of the present disclosure, and thus the display brightness is significantly increased, the power consumption is reduced, and the life-time of the display panel is prolonged.

For example, the thickness in the direction perpendicular to the base substrate 1 of the first color filter layer 103 in the green sub-pixel is configured that the optical path difference between the second light b which is generated by reflection of the first light a by a light-exiting surface of the display panel and the third light c generated by the first light a which is reflected by a reflective surface of the first color filter layer 103 and exits from the light-exiting surface of the display panel is equal to odd number of times of half-wavelength of the first light a; the first light a is the green light, which is propagated toward the light-exiting surface of the display panel, in the ambient light. Therefore, a destructive interference occurs on the green light, which enters the green sub-pixel, of the ambient light. Because human eyes are most sensitive to the green light, the adverse influence of the ambient light is significantly reduced by reducing the green light, so that it is not necessary to provide a circular polarizer at the side, where the light-exiting surface of the display panel is located, of the display panel provided by at least one embodiment of the present disclosure, and thus the display brightness is significantly increased, the power consumption of the display panel is reduced, and the life-time of the display panel is prolonged.

Referring to FIG. 2, in practical applications, the first light a which is propagated toward the display panel is the green light in the ambient light, a part of the first light a is reflected by the display panel so as to obtain the second light b, another part of the first light a enters inside the display panel, and is reflected by the reflection layer 102, so as to obtain the third light c, interference of the second light b and the third light c occurs at the light-exiting surface of the display panel; by adjusting the thickness of the first color filter layer 103 to allow the optical path difference between the second light b and the third light c to be equal to odd number of times of half-wavelength of the first light, destructive interference of the second light b and the third light occurs, so that the intensity of the green light of the ambient light is reduced, and the adverse influence of the ambient light on the display panel is reduced.

In specific implementations, during determining the thickness of the first color filter layer, for example, monochromatic light is used as the first light to calculate the thickness of the first color filter layer. For example, the wavelength of the peak of the wave of the green light spectrum is set to be 550 nm~560 nm, for example, 555 nm, and this green light serves as the first light to determine the thickness of the first color filter layer 103; in practical applications, after the green light with a wavelength equal to 550 nm~560 nm, especially equal to 555 nm enters the display panel, the extent of the destructive interference is the largest; when the green light with the wavelength equal to 550 nm~560 nm, especially equal to 555 nm enters the display panel, the intensity of the exiting light is reduced to a certain extent, so that the intensity of most of the green light in the ambient light is reduced. In addition, the wavelength of the first light may also adopt other wavelength in the green light wavelength range, and no limitation is given here.

For example, in the above-mentioned display panel provided by an embodiment of the present disclosure, the light emitted by the light-emitting layer in the red sub-pixel 205 comprises red light, and a red stationary wave is formed in the red sub-pixel by the red light emitted by the light-emitting layer in the red sub-pixel 205 and the red light, which enters the red sub-pixel, in the ambient light. The two red light refer to the light with the same wavelength and can generate the stationary wave. The thickness in the direction perpendicular to the base substrate 1 of the first color filter layer in the red sub-pixel 203 is configured to allow the light-emitting layer in the red sub-pixel 205 to be at an antinode of the red stationary wave. By this way, constructive interference of the red light emitted by the light-emitting layer 205 occurs, and the intensity of the exiting light of the red light is increased.

The cavity length of the micro-cavity is the optical difference between the surface of the reflection layer away from the base substrate and an upper surface of the second electrode. For example, the cavity length of the micro-cavity is represented by L, and $L=\sum n_i d_i = n_1 d_1 + n_2 d_2 + n_3 d_3 + n_4 d_4$; $n_i$ represents the refractive indexes of the layers; $d_i$ represents the thicknesses of the layers. Specifically, $n_1$ and $d_1$ respectively represent the refractive index of the first electrode and the thickness of the first electrode in the direction perpendicular to the base substrate; $n_2$ and $d_2$ respectively represent the refractive index of the first color filter layer and the thickness of the first color filter layer in the direction perpendicular to the base substrate; $n_3$ and $d_3$ respectively represent the refractive index of the light-emitting layer and the thickness of the light-emitting layer in the direction perpendicular to the base substrate; $n_4$ and $d_4$ respectively represent the refractive index of the second electrode and the thickness of the second electrode in the direction perpendicular to the base substrate. The light-emitting layer is at the node of the cavity length of the micro-cavity, that is, the optical distance of the cavity length of the micro-cavity satisfies:

$$L = \sum n_i d_i = \frac{k\lambda}{2}.$$

Here, λ represents the wavelength of the exiting light of the sub-pixel, k is an antinode coefficient and k is a positive integer. The light enters into the reflection layer and the light that is reflected by the reflection layer are superposed so as to generate a stationary wave, that is, the portion of light in the micro-cavity structure is propagated in a form of a stationary wave. In the case where the light-emitting layer is at the antinode of the cavity length of the micro-cavity, the amplitude of the stationary wave obtained by the interference of is relatively large, that is, the intensity of the light that is propagated in the micro-cavity structure is relatively large. Therefore, the thickness in the direction perpendicular to the base substrate 1 of the first color filter layer 103 of the red sub-pixel can be adjusted to allow the light-emitting layer in the red sub-pixel to be at the antinode of the red stationary wave, so as to increase the intensity of the red light. In the red sub-pixel, $$L = \sum n_i d_i = \frac{k\lambda}{2}$$

is satisfied. Here, λ represents the wavelength of the red light exiting from the sub-pixel, and k is a positive integer.

For example, the thickness in the direction perpendicular to the base substrate 1 of the first color filter layer in the red sub-pixel 203 is configured to allow the light-emitting layer 204 in the red sub-pixel to be at the second antinode of the red stationary wave (the surface of the second electrode facing toward the light-emitting layer is taken as a reference surface). That is, $$L = \sum n_i d_i = \frac{k\lambda}{2}$$

is satisfied, and k=2. In the case where the light-emitting layer is at the second antinode of the red stationary wave, the amplitude of the red stationary wave obtained by the interference is the largest, that is, the intensity of the red light that is propagated in the micro-cavity structure is the largest. Therefore, the thickness of the first color filter layer in the red sub-pixel can be adjusted, so as to allow the light-emitting layer in the red sub-pixel to be at the second antinode of the red stationary wave, so as to increase the intensity of the red light that exits from the second electrode.

Based on the similar principle, in the above-mentioned display panel provided by an embodiment of the present disclosure, the thickness of the first color filter layer corresponding to the blue sub-pixel is configured that the light-emitting layer corresponding to the blue sub-pixel is at the second antinode of the cavity length of the micro-cavity corresponding to the blue sub-pixel; the cavity length of the micro-cavity is the distance between the surface of the reflection layer away from the base substrate and the surface of the second electrode away from the base substrate.

For example, light emitted by the light-emitting layer 303 in the blue sub-pixel comprises blue light, and a blue stationary wave is generated in the blue sub-pixel by the blue light emitted by the light-emitting layer 303 in the blue sub-pixel and the blue light, that enters the blue sub-pixel, in the ambient light. Similar to the adjusting principle of the thickness of the first color filter layer corresponding to the above-mentioned red sub-pixel, the thickness in the direction perpendicular to the base substrate 1 of the first color filter layer 303 in the blue sub-pixel is configured to allow the light-emitting layer in the blue sub-pixel to be at the antinode of the blue stationary wave by adjusting the thickness of the first color filter layer of the blue sub-pixel. For example, the thickness in the direction perpendicular to the base substrate 1 of the first color filter layer 303 in the blue sub-pixel is configured to allow the light-emitting layer 303 in the blue sub-pixel to be at the second antinode of the blue stationary wave, so as to allow the amplitude of the blue stationary wave obtained by the interference to be the largest, that is, the intensity of the blue light that is propagated in the micro-cavity structure is the largest. Therefore, the thickness of the first color filter layer of the blue sub-pixel can be adjusted, so as to allow the light-emitting layer in the blue sub-pixel to be at the second antinode of the blue stationary wave, so that the intensity of the blue light that exits from the second electrode is increased.

The relationship between the thicknesses of the first color filter layers in the sub-pixels as illustrated in FIG. 2 is only an example for illustration. In specific implementation, it is only required that the thicknesses of the first color filter layers of the sub-pixels respectively satisfy the above-mentioned conditions, no limitation is given here regarding the relationship between the thicknesses of the first color filter layers in the sub-pixels of each pixel.

In practical applications, in the above-mentioned display panel provided by an embodiment of the present disclosure, as illustrated in FIG. 2, for example, each of the plurality of sub-pixels further comprises: a second color filter layer 107 at a side of the second electrode 106 away from the base substrate 101; in each sub-pixel, the color of the second color filter layer 107 is the same as the color of the first color filter layer 103.

In each sub-pixel, the second color filter layer with a color same as the color of the first color filter layer is disposed, that is, each sub-pixel comprises a dual color filter structure. In this way, during realizing color display, the requirement on the material of the light-emitting layer can be lowered, and stray light of other color can be filtered, so that the color purity of the light exiting from the sub-pixels is increased, and the color gamut of the display panel is further increased. In a specific implementation, for example, both the first color filter layer and the second color filter layer are formed by an exposure-development method; for example, the first color filter layers of the sub-pixels of the same color are formed by one same patterning process, the second color filter layers of the sub-pixels of the same color are formed by one same patterning process. The following description takes that each pixel comprises three sub-pixels of red color, green color and blue color as an example, and for example, the first color filter layers of the red sub-pixels are formed by a first patterning process, the first color filter layers of the green sub-pixels are formed by a second patterning process, and the first color filter layers of the blue sub-pixels are formed by a third patterning process, so that the thicknesses of the first color filter layers of the sub-pixels of different colors are different from each other. The above description is only an example, no limitation is given regarding the orders of the manufacturing processes of the sub-pixels. The second color filter layers are formed by similar manufacturing processes, and no further description is given here.

Specifically, in the above-mentioned display panel provided by an embodiment of the present disclosure, the light-emitting layer in each pixel may be arranged in at least the following two modes.

First Arrangement Mode:

In each pixel, the color of the light emitted by the light-emitting layer corresponding to each sub-pixel is the same as the color of the second color filter layer of the respective sub-pixel.

That is, the display panel adopts a pixel side by side (SBS) method to arrange the sub-pixels of red color, green color and blue color in the display panel. The following description takes that each pixel comprises three sub-pixels of red color, green color and blue color as an example, the light-emitting layer in the red sub-pixel emits red light, and the first color filter layer and the second color filter layer in the red sub-pixel transmit only the red light; the light-emitting layer in the green sub-pixel emits green light, and the first color filter layer and the second color filter layer in the green sub-pixel transmit only the green light; the light-emitting layer in the blue sub-pixel emits blue light, and the first color filter layer and the second color filter layer in the blue sub-pixel transmit only the blue light. In addition, because each sub-pixel comprises the first color filter layer and the second color filter layer, the color purity of the light exiting from each sub-pixel is relatively high, and the color gamut of the display panel is increased.

Second Arrangement Mode:

In each of the plurality of pixels, the light emitted by the light-emitting layers of the plurality of sub-pixels is white light.

That is, in each pixel, for example, the light-emitting layers of the sub-pixels are set to be the same structure; in this way, during an actual manufacturing process of the display panel, the light-emitting layers of the sub-pixels can be simultaneously formed, so that the difficulty of the manufacturing processes is reduced. In addition, because each sub-pixel comprises the first color filter layer and the second color filter layer, the color purity of the light exiting from each sub-pixel is relatively high, and the color gamut of the display panel is increased.

In practical applications, in the above-mentioned display panel provided by at least one embodiment of the present disclosure, as illustrated in FIG. 1 and FIG. 2, the display panel may further comprise: an encapsulation cover plate 108 at a side of the layer where the second color filter layer 107 is located away from the base substrate 101.

The display panel in an embodiment of the present disclosure adopts an encapsulation method of epoxy resin+ air filler (Dam & filler); during the encapsulation processes, firstly, the second color filter layer 107 and the planarization layer (resin) of the sub-pixels are formed on the encapsulation cover plate 108, and the encapsulation layer 109 is formed on the second electrode 106, and then encapsulation cover plate 108 and the base substrate 101 formed with the encapsulation layer 109 are aligned and encapsulated after the encapsulation cover plate 108 is flipped 180°.

In the second aspect, based on the same inventive concept, at least one embodiment of the present disclosure provides a display device, and the display device comprises the above-mentioned display panel. The display device may be applied in any products or device that has display function, such as a cell phone, a tablet computer, a television, a display screen, a laptop, a digital photo frame and a navigator. Because the principle of solving the problem of the display device is similar to the above-mentioned display panel, the implementation of the display device may refer to the implementation of the above-mentioned display panel, and no further descriptions is given for the repeated content.

For the display panel and the display device provided by an embodiment of the present disclosure, by providing the reflection layer and the first color filter layer between the first electrode and the base substrate, a micro-cavity structure is formed between the reflection layer and the second electrode, and the thicknesses of the first color filter layers of the sub-pixels are different from each other, and therefore, the cavity length of each micro-cavity of each sub-pixel is adjusted by changing the thickness of the first color filter layer, so as to allow a destructive interference to occur on the green light, which enters each sub-pixel, in the ambient light, and allow the red light and the blue light which are emitted by the light-emitting layer and the red light and the blue light which are in the ambient light to be increased. Because human eyes are most sensitive to the green light, the adverse influence of the ambient light is significantly reduced by reducing the green light, so that it is not necessary to provide a circular polarizer at the side, where the light-exiting surface of the display panel is located, of the display panel provided by an embodiment of the present disclosure, and thus the brightness of the display panel is significantly increased, the power consumption of the display panel is reduced, and the life-time of the display panel is prolonged.

At least one embodiment of the present disclosure further provides a manufacturing method of a display panel. The method includes: providing a base substrate; forming a plurality of pixels which are arranged in an array on the base substrate, in which each of the plurality of pixels includes a plurality of sub-pixels of different color; forming the each of the plurality of sub-pixels includes: forming a reflection layer on the base substrate; forming a first color filter layer, in which the first color filter layer is at a side of the reflection layer away from the base substrate; forming a first electrode, in which the first electrode is at a side of the first color filter layer away from the base substrate; forming a light-emitting layer, in which the light-emitting layer is at a side of the first electrode away from the base substrate; and forming a second electrode, in which the second electrode is at a side of the light-emitting layer away from the base substrate. In each of the plurality of pixels, a color of the first color filter layer of each of the plurality of sub-pixels is same as a color of the respective sub-pixel where the first color filter layer of the respective sub-pixel is located, and thicknesses of the first color filter layers of the plurality of sub-pixels are different from each other.

For example, both the first color filter layer and the second color filter layer are color films, for example, are optical filters, and for the specific manufacturing method of the first color filter layer and the second color filter layer, those skilled in the art may refer to conventional technologies. For example, the first color filter layers in the red sub-pixels are simultaneously formed by a first color filter process, then, the first color filter layers in the green sub-pixels are simultaneously formed by a second color filter process, later, the first color filter layers in the blue sub-pixels are simultaneously formed by a third color filter process. By forming the first color filter layers with different thicknesses, the thicknesses of the first electrodes of the plurality of sub-pixels may be the same, and the thicknesses of the second electrodes of the plurality of sub-pixels may be the same, and therefore, the first electrodes of the plurality of sub-pixels may be formed by performing one patterning process on the same layer, and the second electrodes of the sub-pixels may be formed by performing one patterning process on the same film layer.

For example, the reflection layers of the plurality of sub-pixels are formed by an evaporation method. For example, the reflection layers of the plurality of sub-pixels are formed on the base substrate by the evaporation method, and then the first color filter layers are formed on the reflection layers.

For example, in the display panel formed by the above-mentioned method, each of the plurality of pixels comprises a red sub-pixel, a green sub-pixel and a blue sub-pixel; the thickness in the direction perpendicular to the base substrate of the first color filter layer of the green sub-pixel is configured to allow an optical path difference between second light which is generated by reflection of first light by a light-exiting surface of the display panel and third light generated by the first light which is reflected by a reflective surface of the first color filter layer and exited from the light-exiting surface of the display panel to be equal to odd number of times of half-wavelength of the first light. The first light is green light, which is propagated toward the light-exiting surface of the display panel, in ambient light.

For example, for the display panel formed by the above-mentioned method, the light that is emitted by the light-emitting layer in the red sub-pixel comprises red light; a red stationary wave is generated in the red sub-pixel by the red light emitted by the light-emitting layer in the red sub-pixel and red light, that enters the red sub-pixel, in the ambient light; the thickness in the direction perpendicular to the base substrate of the first color filter layer of the red sub-pixel is configured to allow the light-emitting layer in the red sub-pixel to be at an antinode of the red stationary wave. For example, the light that is emitted by the light-emitting layer in the blue sub-pixel comprises blue light; a blue stationary wave is generated in the blue sub-pixel by the blue light emitted by the light-emitting layer in the blue sub-pixel and blue light, that enters in the blue sub-pixel, in ambient light; the thickness in the direction perpendicular to the base substrate of the first color filter layer of the blue sub-pixel is configured to allow the light-emitting layer in the blue sub-pixel to be at an antinode of the blue stationary wave.

Other features and technical effects of the display panel formed by the above-mentioned method are the same as the foregoing embodiments, please refer to the foregoing descriptions, and no further descriptions is given here.

What are described above is related to the illustrative embodiments of the disclosure only and not limitative to the scope of the disclosure; the scopes of the disclosure are defined by the claims.

What is claimed is:

1. A display panel, comprising: a base substrate, and a plurality of pixels arranged in an array on the base substrate,
   wherein each of the plurality of pixels comprises a plurality of sub-pixels of different colors;
   each of the plurality of sub-pixels comprises:
   a reflection layer on the base substrate;
   a first color filter layer at a side of the reflection layer away from the base substrate;
   a first electrode at a side of the first color filter layer away from the base substrate;
   a light-emitting layer at a side of the first electrode away from the base substrate; and
   a second electrode at a side of the light-emitting layer away from the base substrate, and
   in each of the plurality of pixels, a color of the first color filter layer of each of the plurality of sub-pixels is a same as a color of a respective sub-pixel where the first color filter layer of the respective sub-pixel is located, and thicknesses in a direction perpendicular to the base substrate of first color filter layers of the plurality of sub-pixels are different from each other, wherein each of the plurality of pixels comprises a red sub-pixel, a green sub-pixel, and a blue sub-pixel;
   a thickness in the direction perpendicular to the base substrate of the first color filter layer of the green sub-pixel is configured such that an optical path difference between second light which is generated by reflection of first light by a light-exiting surface of the display panel and third light generated by the first light which is reflected by a reflective surface of the first color filter layer and exits from the light-exiting surface of the display panel is equal to an odd number of times of a half-wavelength of the first light; and
   the first light is green light, which is propagated toward the light-exiting surface of the display panel, in ambient light.

2. The display panel according to claim 1, wherein the first electrode is a transparent electrode layer or a transflective electrode layer, and the second electrode is a transparent electrode layer or a transflective electrode layer.

3. The display panel according to claim 1, wherein a wavelength of the green light is 550 nm 560 nm.

4. The display panel according to claim 1, wherein light that is emitted by the light-emitting layer in the red sub-pixel comprises red light;
   a red stationary wave is generated in the red sub-pixel by the red light emitted by the light-emitting layer in the red sub-pixel and red light, that enters in the red sub-pixel, in the ambient light; and
   a thickness in the direction perpendicular to the base substrate of the first color filter layer of the red sub-pixel is configured to allow the light-emitting layer in the red sub-pixel to be at an antinode of the red stationary wave.

5. The display panel according to claim 4, wherein the thickness in the direction perpendicular to the base substrate of the first color filter layer of the red sub-pixel is configured to allow the light-emitting layer in the red sub-pixel to be at a second antinode of the red stationary wave.

6. The display panel according to claim 1, wherein light that is emitted by the light-emitting layer in the blue sub-pixel comprises blue light;
a blue stationary wave is generated in the blue sub-pixel by the blue light emitted by the light-emitting layer in the blue sub-pixel and blue light, that enters in the blue sub-pixel, in the ambient light; and
a thickness in the direction perpendicular to the base substrate of the first color filter layer of the blue sub-pixel is configured to allow the light-emitting layer in the blue sub-pixel to be at an antinode of the blue stationary wave.

7. The display panel according to claim 6, wherein the thickness in the direction perpendicular to the base substrate of the first color filter layer of the blue sub-pixel is configured to allow the light-emitting layer in the blue sub-pixel to be at a second antinode of the blue stationary wave.

8. A display panel, comprising: a base substrate, and a plurality of pixels arranged in an array on the base substrate,
wherein each of the plurality of pixels comprises a plurality of sub-pixels of different colors;
each of the plurality of sub-pixels comprises:
a reflection layer on the base substrate;
a first color filter layer at a side of the reflection layer away from the base substrate;
a first electrode at a side of the first color filter layer away from the base substrate;
a light-emitting layer at a side of the first electrode away from the base substrate; and
a second electrode at a side of the light-emitting layer away from the base substrate, and
in each of the plurality of pixels, a color of the first color filter layer of each of the plurality of sub-pixels is a same as a color of a respective sub-pixel where the first color filter layer of the respective sub-pixel is located, and thicknesses in a direction perpendicular to the base substrate of the first color filter layers of the plurality of sub-pixels are different from each other, wherein each of the plurality of sub-pixels further comprises: a second color filter layer at a side of the second electrode away from the base substrate; and
in each of the plurality of sub-pixels, a color of the second color filter layer is the same as the color of the first color filter layer.

9. The display panel according to claim 8, wherein, in each of the plurality of pixels, the light-emitting layer in each of the plurality of sub-pixels emits monochromatic light, and a color of the monochromatic light is the same as the color of the second color filter layer.

10. The display panel according to claim 1, wherein, in each of the plurality of pixels, light emitted by the light-emitting layer in each of the plurality of sub-pixels is white light.

11. The display panel according to claim 1, wherein each of the plurality of sub-pixels further comprises a hole injection layer and a hole transport layer which are between the first electrode and the light-emitting layer and sequentially stacked in the direction perpendicular to the base substrate.

12. The display panel according to claim 1, wherein each of the plurality of sub-pixels further comprises an electron injection layer and an electron transport layer which are between the second electrode and the light-emitting layer and sequentially stacked in the direction perpendicular to the base substrate.

13. The display panel according to claim 8, further comprising: an encapsulation cover plate at a side of the second color filter layer away from the base substrate.

14. A display device, comprising: the display panel according to claim 1.

15. A manufacturing method of a display panel, comprising:
providing a base substrate;
forming a plurality of pixels arranged in an array on the base substrate, wherein each of the plurality of pixels comprises a plurality of sub-pixels of different colors, and forming the each of the plurality of sub-pixels comprises:
forming a reflection layer on the base substrate;
forming a first color filter layer, wherein the first color filter layer is at a side of the reflection layer away from the base substrate;
forming a first electrode, wherein the first electrode is at a side of the first color filter layer away from the base substrate;
forming a light-emitting layer, wherein the light-emitting layer is at a side of the first electrode away from the base substrate; and
forming a second electrode, wherein the second electrode is at a side of the light-emitting layer away from the base substrate,
wherein, in each of the plurality of pixels, a color of the first color filter layer of each of the plurality of sub-pixels is the same as a color of a respective sub-pixel where the first color filter layer of the respective sub-pixel is located, and thicknesses of the first color filter layers of the plurality of sub-pixels are different from each other.

16. The manufacturing method of the display panel according to claim 15, wherein the each of the plurality of pixels comprises a red sub-pixel, a green sub-pixel, and a blue sub-pixel;
a thickness in a direction perpendicular to the base substrate of the first color filter layer of the green sub-pixel is configured to allow an optical path difference between second light which is generated by reflection of first light by a light-exiting surface of the display panel and third light generated by the first light which is reflected by a reflective surface of the first color filter layer and exited from the light-exiting surface of the display panel to be equal to an odd number of times of a half-wavelength of the first light; and
the first light is green light, which is propagated toward the light-exiting surface of the display panel, in ambient light.

17. The manufacturing method of the display panel according to claim 16, wherein light that is emitted by the light-emitting layer in the red sub-pixel comprises red light;
a red stationary wave is generated in the red sub-pixel by the red light emitted by the light-emitting layer in the red sub-pixel and red light, that enters in the red sub-pixel, in the ambient light; and
the thickness in the direction perpendicular to the base substrate of the first color filter layer of the red sub-pixel is configured to allow the light-emitting layer in the red sub-pixel to be at an antinode of the red stationary wave.

18. The manufacturing method of the display panel according to claim 16, wherein light that is emitted by the light-emitting layer in the blue sub-pixel comprises blue light;
- a blue stationary wave is generated in the blue sub-pixel by the blue light emitted by the light-emitting layer in the blue sub-pixel and blue light, that enters in the blue sub-pixel, in the ambient light; and
- the thickness in the direction perpendicular to the base substrate of the first color filter layer of the blue sub-pixel is configured to allow the light-emitting layer in the blue sub-pixel to be at an antinode of the blue stationary wave.

19. The display panel according to claim 8, wherein each of the plurality of pixels comprises a red sub-pixel, a green sub-pixel, and a blue sub-pixel;
- a thickness in the direction perpendicular to the base substrate of the first color filter layer of the green sub-pixel is configured such that an optical path difference between second light which is generated by reflection of first light by a light-exiting surface of the display panel and third light generated by the first light which is reflected by a reflective surface of the first color filter layer and exits from the light-exiting surface of the display panel is equal to an odd number of times of a half-wavelength of the first light; and
- the first light is green light, which is propagated toward the light-exiting surface of the display panel, in ambient light.

* * * * *